United States Patent [19]

Heinz et al.

[11] 4,430,417

[45] Feb. 7, 1984

[54] PHOTOPOLYMERIZABLE MIXTURES CONTAINING ELASTOMERIC BLOCK POLYMERS AND PHOTOCURABLE ELEMENTS PRODUCED THEREFROM

[75] Inventors: Gerhard Heinz, Weisenheim; Peter Richter, Frankenthal; Wolfgang F. Mueller, Neustadt, all of Fed. Rep. of Germany

[73] Assignee: BASF Aktiengesellschaft, Fed. Rep. of Germany

[21] Appl. No.: 419,492

[22] Filed: Sep. 17, 1982

[30] Foreign Application Priority Data

Sep. 19, 1981 [DE] Fed. Rep. of Germany ....... 3137416

[51] Int. Cl.$^3$ .............................. G03C 1/68
[52] U.S. Cl. .................... 430/286; 430/281; 430/907; 204/159.15; 204/159.17
[58] Field of Search ............... 430/905, 907, 910, 286, 430/281; 204/159.15, 159.17

[56] References Cited

U.S. PATENT DOCUMENTS

| 3,674,486 | 7/1972 | Milgrom | 96/35.1 |
|---|---|---|---|
| 4,045,231 | 8/1977 | Toda et al. | 96/115 P |
| 4,151,057 | 4/1979 | St. Clair et al. | 204/159.17 |
| 4,162,919 | 7/1979 | Richter et al. | 96/87 R |
| 4,179,531 | 12/1979 | Hein et al. | 430/300 |
| 4,197,130 | 4/1980 | Nakamura et al. | 430/286 |
| 4,265,986 | 5/1981 | Allen et al. | 430/281 X |
| 4,266,005 | 5/1981 | Nakamura et al. | 430/271 |
| 4,320,188 | 3/1982 | Heinz et al. | 430/281 |
| 4,394,435 | 7/1983 | Farber et al. | 430/905 X |

FOREIGN PATENT DOCUMENTS 1366769 9/1974 United Kingdom .
1395822 5/1975 United Kingdom .

OTHER PUBLICATIONS

Foster D. Snell and Leslie S. Ettre (eds.), *Encyclopedia of Industrial Chemical Analysis*, vol. 12, "Elastomers, Synthetic", John Wiley and Sons, Inc., New York, 1971, pp. 81–88, 132–134.

*Primary Examiner*—John E. Kittle
*Assistant Examiner*—Cynthia Hamilton
*Attorney, Agent, or Firm*—Keil & Witherspoon

[57] ABSTRACT

Photopolymerizable mixtures of (a) one or more block copolymers, (b) one or more photopolymerizable, ethylenically unsaturated, low molecular weight compounds and (c) a photopolymerization initiator, with or without (d) other additives, contain as component (a) block copolymers which are composed solely of elastomeric polymer blocks, and contain two or more elastomeric polymer blocks having a glass transition temperature of from $-20°$ C. to $+15°$ C., linked by one or more elastomeric polymer blocks having a glass transition temperature of below $-20°$ C.

9 Claims, No Drawings

PHOTOPOLYMERIZABLE MIXTURES CONTAINING ELASTOMERIC BLOCK POLYMERS AND PHOTOCURABLE ELEMENTS PRODUCED THEREFROM

The present invention relates to photopolymerizable mixtures for the production of photocurable adhesives, webs of resilient and flexible sheet material, and relief plates, which, in addition to a photoinitiator and one or more ethylenically unsaturated, low molecular weight compounds contain an elastomeric block copolymer.

Photopolymerizable mixtures for the production of shaped articles, in particular of relief printing plates for flexographic printing, are known per se and are disclosed in, for example, British Patent Nos. 1,366,769 and 1,395,822, German Laid-Open Applications DOS Nos. 2,815,678, DOS 2,939,989 and DOS 2,942,183 and U.S. Pat. Nos. 3,674,486, 4,045,231, 4,162,919 and 4,179,531. These conventional photopolymerizable mixtures contain, as the polymer for the relief-forming photopolymerizable layer, an elastomeric block copolymer which in addition to one or more elastomeric polymer blocks, for example containing isoprene or butadiene units, contains one or more non-elastomeric, thermoplastic polymer blocks, for example of polystyrene. However, the relief printing plates produced from these photopolymerizable mixtures tend, on storage, especially if mounted on a press cylinder, to develop crazing in the printing surface. This crazing greatly lowers the quality of the prints and a printing plate, once it has been produced, becomes, in a matter of days, unfit for re-use.

It is an object of the present invention to provide photopolymerizable mixtures which are suitable for the production of relief plates, especially for the production of flexographic printing plates, can be produced simply, economically and with readily reproductible properties, can be processed by conventional methods and give relief printing plates which not only produce true-to-original prints and exhibit good resistance to conventional printing ink solvents but also have very little tendency to craze, so that they can be re-used a large number of times even after prolonged storage.

We have found that, surprisingly, this object is achieved if the photopolymerizable mixture contains, as a polymeric binder, an elastomeric block copolymer composed of three or more polymer blocks, of which none is a thermoplastic block, the polymer being composed, instead, solely of elastomeric polymer blocks with different glass transition temperatures.

Accordingly, the present invention relates to photopolymerizable mixtures which contain (a) from 40 to 99% by weight, based on (a) and (b), of one or more elastomeric block copolymers which contain three or more chemically linked polymer blocks and are soluble in a developer solvent, (b) from 1 to 60% by weight, based on (a) and (b), of one or more photopolymerizable ethylenically unsaturated low molecular weight compounds compatible with the elastomeric block copolymer (a), (c) from 0.1 to 10% by weight, based on the total photopolymerizable mixture, of one or more photopolymerization initiators, and (d) from 0 to 40% by weight, based on the total photopolymerizable mixture, of further additives, wherein the block copolymer (a) is composed only of elastomeric polymer blocks and contains two or more elastomeric polymer blocks having a glass transition temperature of from −20° C. to +15° C. and one or more elastomeric polymer blocks located between two such blocks and having a glass transition temperature of below −20° C.

The invention further relates to the production of photosensitive multilayer elements which are suitable for the production of relief printing plates and which contain a photosensitive layer of the above photopolymerizable mixture on a dimensionally stable base. The invention yet further relates to special embodiments of the photopolymerizable mixtures and of the multilayer elements, as described in detail below.

Since, in the prior art, photopolymerizable mixtures only employed block copolymers which contained one or more thermoplastic polymer blocks, it was not only surprising that photopolymerizable mixtures suitable for the production of relief printing plates are obtained even if a block copolymer composed only of elastomeric blocks is used as the polymeric binder, but it was also entirely unforeseeable that using the photopolymerizable mixtures according to the invention it would be possible to produce relief printing plates which in addition to having excellent printing properties and performance characteristics would also, without any special additional measures, exhibit high resistance to crazing on storage.

The photopolymerizable mixtures according to the invention contain, as the binder component (a), block copolymers which are devoid of thermoplastic blocks and are composed of three or more elastomeric polymer blocks, there being located, between two elastomeric polymer blocks having a glass transition temperature of from −20° C. to +15° C., one or more, and preferably only one, elastomeric polymer block different from the said two polymer blocks and having a glass transition temperature of below −20° C. The elastomeric polymer blocks having a glass transition temperature of from −20° C. to +15° C. may be identical or different, both in respect of chemical structure or in respect of molecular weight, but it has proved advantageous if they are identical. Moreover, the block copolymers to be employed according to the invention can also contain a plurality of elastomeric polymer blocks having a glass transition temperature of below -20° C., provided there is at least one such block between two elastomeric polymer blocks having a glass transition temperature of from −20° C. to +15° C. Preferred elastomeric block copolymers are those where the elastomeric polymer blocks having a glass transition temperature of from −20° C. to +15° C. are the terminal blocks. These include not only three-block copolymers but also, for example, five-block or seven-block copolymers. Preferred block copolymers to use in the novel photopolymerizable mixtures are elastomeric three-block copolymers in which the two terminal elastomeric polymer blocks having glass transition temperatures of from −20° C. to +15° C. are linked by a central elastomeric polymer block having a glass transition temperature of below −20° C.

The elastomeric block copolymers (a) used in the novel mixtures in general have an intrinsic viscosity, measured in 0.5% strength by weight toluene solution at 25° C., of from about 60 to 350 ml/g and especially from about 100 to 200 ml/g, corresponding to a mean molecular weight $M_v$ of from 60,000 to 300,000, preferably from about 100,000 to 200,000. The elastomeric polymer blocks having a glass transition temperature of from −20° C. to +15° C. usually have a viscosity-average molecular weight of from 5,000 to about 100,000; the viscosity-average molecular weight of the elastomeric polymer blocks having a glass transition temperature of below −20° C. is on the other hand in general from about 20,000 to 200,000. The proportion of the individual polymer blocks in the block copolymer can vary within wide limits; for example, the elastomeric polymer block or blocks having a glass transition temperature of below −20° C. can account for from 10 to 90% by weight of the total block copolymer. Very suitable block copolymers contain from 40 to 90% by weight of elastomeric polymer blocks having a glass transition temperature of below −20° C. and from 60 to 10% by weight of elastomeric polymer blocks having a glass transition temperature of from −20° C. to +15° C.

The elastomeric block copolymers to be used according to the invention are in particular synthesized from aliphatic conjugated diolefins and vinyl-aromatic hydrocarbons. Preferred diolefins are the aliphatic conjugated diene hydrocarbons of 4 or 5 carbon atoms, especially butadiene and isoprene. Amongst vinyl-aromatic hydrocarbons, styrene and styrene derivatives, eg. nuclear-substituted and sidechain-substituted styrenes, are particularly suitable. Styrene and styrene derivatives are, for simplicity, hereafter referred to collectively as styrene monomers. Specific examples of styrene monomers are α-methylstyrene, vinyltoluenes, tert.-butylstyrene and especially styrene itself.

The elastomeric polymer block having a glass transition temperature of below −20° C. can be, for example, a pure polybutadiene block or polyisoprene block; however, the polymer block can also be a copolymer of butadiene and isoprene or of butadiene and/or isoprene and styrene monomers in random distribution of the monomer units. If the elastomeric polymer block having a glass transition temperature of below −20° C. contains styrene monomer units, the proportion of these must be such that the glass transition temperature of the block remains below −20° C. Preferably, the said polymer blocks are pure polybutadiene blocks or, more preferably still, pure polyisoprene blocks.

In view of their different glass transition temperatures, the elastomeric polymer blocks having a transition temperature of from −20° C. to +15° C. are also different in chemical structure from the elastomeric polymer block having a glass transition temperature of below −20° C. For example, the former blocks can be butadiene homopolymer blocks in which more than 75% by weight of the polymerized butadiene units have the 1,2-configuration, or isoprene homopolymer blocks in which more than 40% by weight of the polymerized isoprene units have the 3,4-configuration. More especially, however, the elastomeric polymer blocks having a glass transition temperature of from −20° C. to +15° C. are copolymer blocks of aliphatic conjugated diene hydrocarbons of 4 or 5 carbon atoms, eg. butadiene and/or isoprene, and styrene monomers, the distribution of the comonomer units in the block being random. The proportion of copolymerized diene hydrocarbon units in such a random copolymer block is advantageously from 65 to 30% by weight, especially from 50 to 30% by weight, whilst that of the copolymerized styrene units is advantageously from 35 to 70% by weight, especially from 50 to 70% by weight, in each case based on the weight of the random copolymer block, the proportions of the various comonomers being subject, in particular, to the limits imposed by the required glass transition temperature of the block.

Typical examples of the elastomeric block copolymers to be employed according to the invention are three-block copolymers wherein the two terminal polymer blocks are random copolymer blocks of styrene and butadiene and/or isoprene, whilst the central polymer block is a butadiene or isoprene homopolymer block.

The elastomeric block copolymers employed in the photopolymerizable mixtures according to the invention can be obtained by conventional methods of preparation. For example, the block copolymers of aliphatic diene hydrocarbons and styrene monomers can advantageously be prepared by sequential anionic polymerization, advantageously using—where random copolymer blocks are to be obtained—the monomer feed technique. For details of the methods of preparation of block copolymers, reference may be made to the relevant literature.

For certain applications, and to obtain improved oxidation resistance and aging resistance, the elastomeric block copolymers based on diene hydrocarbons can also be partially or completely hydrogenated. Such block copolymers also include selectively hydrogenated products in which only the olefinic double bonds but not the aromatic double bonds have been hydrogenated.

Depending on the particular applications it is of course also possible to use, as the polymeric binder (a) in the photopolymerizable mixture, a mixture of elastomeric block copolymers of the stated type and/or a mixture with minor amounts of other, compatible polymers, especially elastomers.

By varying the nature of the elastomeric block copolymers used, for example in respect of the molecular weights and chemical composition of the individual polymer blocks, it is possible to control the mechanical properties and use characteristics of the novel photopolymerizable mixtures within a wide range, to suit the particular application. For example, from the point of view of handling non-crosslinked, unexposed layers of the novel photopolymerizable mixtures it is advantageous to formulate mixtures which have very little tendency to cold-flow and to undergo plastic deformation, and which in general are firm and non-tacky at room temperature.

As component (b), the photopolymerizable mixtures according to the invention contain one or more photopolymerizable ethylenically unsaturated low molecular weight compounds which are compatible with the elastomeric block copolymer (a) and in general have a boiling point of above 100° C. under atmospheric pressure. Suitable photopolymerizable ethylenically unsaturated low molecular weight compounds which in general have a molecular weight of below 3,000, preferably of up to 2,000, are the photopolymerizable monomers and/or oligomers conventionally employed in photopolymerizable mixtures, as described, for example, in U.S. Pat. Nos. 2,760,863 and 3,060,023. Amongst the photopolymerizable, ethylenically unsaturated low molecular weight compounds, the esters of acrylic acid and/or methacrylic acid with monohydric or polyhydric alcohols are particularly important. They include, inter alia, butyl acrylate, butyl methacrylate, 2-ethylhexyl acrylate, lauryl acrylate and methacrylate, ethylene glycol diacrylate and dimethacrylate, butane-1,4-diol diacrylate and dimethacrylate, neopentyl glycol diacrylate and dimethacrylate, 3-methylpentanediol diacrylate, 2-hydroxypropyl acrylate and methacrylate, 2-hydroxyethyl acrylate and methacrylate, hexane-1,6-diol diacrylate and dimethacrylate, 1,1,1-trimethylolpropane triacrylate and trimethacrylate, diethylene glycol diacrylate, triethylene glycol diacrylate, tetraethylene glycol diacrylate, tripropylene glycol diacrylate and pentaerythritol tetraacrylate. Vinyl esters of aliphatic monocarboxylic acids, eg. vinyl oleate, and vinyl ethers of alcohols, such as octadecyl vinyl ether and butane-1,4-diol divinyl ether, are also suitable. Further suitable components (b) of the novel photopolymnerizable mixtures are the diesters of fumaric acid and maleic acid, as described, for example, in German Laid-Open Application DOS No. 2,815,678, and reaction products of OH-terminated oligomeric polybutadienes with maleic anhydride or acrylic or methacrylic acid, these reaction products being oligomeric polybutadienes having activated, photopolymerizable olefinic double bonds.

Very suitable photopolymerizable mixtures according to the invention contain from 60 to 95% by weight of the elastomeric block copolymer (a) and from 40 to 5% by weight of the photopolymerizable ethylenically unsaturated low molecular weight compound (b), the percentages in each case being based on the sum of the components (a) and (b).

The photopolymerizable mixture in addition contains an effective amount, in general from 0.01 to 10% by weight and especially from 0.05 to 5% by weight, based on the total mixture, of one or more photopolymerization initiators, for example benzoin, benzoin derivatives, eg. the methyl, isopropyl, n-butyl or iso-butyl ether, symmetrically or unsymmetrically substituted benzil ketals, such as benzil dimethyl ketal and benzil methyl ethyl ketal, acylphosphine oxides of the type described, for example, in German Laid-Open Application DOS No. 2,909,992, and substituted and unsubstituted quinones, eg. ethylanthraquinone, benzanthraquinone, benzophenone and 4,4'-bis-(dimethylamino)-benzophenone. The photopolymerization initiators can be used individually or as mixtures with one another or conjointly with other co-initiators; for example ethylanthraquinone can be used with 4,4'-bis-(dimethylamino)-benzophenone, benzoin methyl ether with triphenylphosphine and diacyl-phosphine oxides with tertiary amines.

The photopolymerizable mixtures can contain other additives and assistants such as are conventionally employed to improve the handling and processing of mixtures of the type in question. Such additives in particular include thermal polymerization inhibitors, for example p-methoxyphenol, hydroquinone, 2,6-di-tert.-butyl-p-cresol, β-naphthol, m-dinitrobenzene, N-nitrosoamines, eg. N-nitrosodiphenylamine, and salts, for example the potassium and aluminum salt, of nitrosocyclohexylhydroxylamine. Such inhibitors must be devoid of any substantial characteristic absorption in the actinic range in which the photoinitiator employed absorbs. The photopolymerization inhibitors are in general employed in amounts of from 0.001 to 2% by weight, preferably from 0.005 to 0.5% by weight, based on the total mixture. Specifically in mixtures according to the invention which contain elastomeric block copolymers having polybutadiene blocks, it is advisable to use inhibitors which act as an antioxidant preventing oxidative rubber degradation.

The novel photopolymerizable mixtures can moreover contain dyes or photochromic additives to control the exposure characteristics. Dyes or pigments may also be added for identification purposes or esthetic purposes, provided that the dyes do not strongly absorb the actinic radiation and provided that they do not interfere with the photopolymerization reaction.

The photopolymerizable mixtures may moreover advantageously contain other additives, for example compatible plasticizers, waxes, fillers or crosslinking assistants, with the aid of which certain special properties depending on the particular application can be obtained and improved. For example, it is advisable to add plasticizers, especially if the photopolymerizable mixtures are to be employed for the production of resilient and flexible coatings having good impact resilience such as are required, for example, in photopolymerizable recording materials for the production of resilient and flexible relief printing plates. Examples of plasticizers are phthalic acid esters, paraffin oils, naphthenic and/or aromatic oils and low molecular weight liquid polyisoprene or polybutadiene compounds. Addition of other materials, for example certain polymers or fillers, eg. oligomeric styrene, low molecular weight styrene copolymers, random styrene/butadiene copolymers with high styrene contents or α-methylstyrene copolymers, can increase the hardness of exposed layers which have been produced from the photopolymerizable mixtures according to the invention. Examples of further additives are silicas with refractive indices matched to that of the photopolymerizable mixture, especially hydrophobic silicas with large surface areas; lubricants, for example calcium stearate, or anti-stick agents, for example small amounts of talc. The additives which influence the resilience and hardness are in general employed in amounts of from 5 to 30% by weight, based on the total photopolymerizable mixture. Moreover, crosslinking assistants can be added to improve the exposure characteristics of the photopolymerizable mixtures, examples being trifunctional or tetrafunctional mercapto compounds, as described for photopolymerizable mixtures of the type in question in, inter alia, U.S. Pat. Nos. 4,179,531 and 4,234,676. For use as photocurable adhesives, tackifying resins, for example hydrocarbon resins, rosin esters, polyterpenes, coumarone-indene resins etc., can be added to the novel photopolymerizable mixtures, as can compounds of the type described in, for example, U.S. Pat. No. 4,133,731. The proportion of the additives and/or assistants in the photopolymerizable mixture should in general not exceed a total of 40% by weight and is usually from 5 to 30% by weight, based on the total mixture.

The novel photopolymerizable mixtures can be prepared in a conventional manner, by homogeneously mixing the individual components, for example in solution, or in a kneader or mixer. The novel mixtures have good processability and are particularly suitable for the production of photosensitive layers for, eg., coatings, adhesives or resilient and flexible layers. Layers of the desired thickness can be produced from the mixtures by, for example, casting a solution in a suitable solvent (such as toluene, xylene, cyclohexane, tetrahydrofuran, methyl isobutyl ketone or tetrachloroethylene) on an appropriate base; this is readily possible because the elastomeric block copolymers used in the novel mixtures have low solution viscosities and hence homogenizing the constituents of the mixture is easy. Layers of the mixture can also be produced by compression molding, extrusion and calendering, and given a suitable choice of inhibitors no incipient thermal crosslinking will occur. The thickness of the layers can be varied within wide limits and easily be chosen to suit the particular application.

In particular, the novel photopolymerizable mixtures for photosensitive multilayer elements are useful in the production of relief plates, for example resists and, especially, resilient and flexible relief plates for flexographic printing. Such photopolymerizable recording materials in general contain a photopolymerizable layer of the novel mixture on a dimensionally stable base, the thickness of the layer usually being from 0.01 to 6.5 mm.

Suitable bases for the photosensitive multilayer recording materials are flexible, dimensionally stable materials having a sufficiently high modulus of elasticity. These include sheets or foils made of metal, for example steel, aluminum and copper, as well as films of high polymers, for example of polyethylene terephthalate, polybutylene terephthalate, nylon or polycarbonate. The choice of the base is not restricted to sheets, foils or films; woven fabrics, eg. glass fiber fabrics, or nonwovens may also be used as bases. The photopolymerizable layer can be directly anchored to a base of high strength and dimensional stability; however, to obtain thicker plates, the thickness corresponding to that of conventional rubber plates which are usually used for flexographic printing, it is possible to use, as a substrate for the photopolymerizable layer, other resilient and flexible underlayers which in turn are firmly bonded to a dimensionally stable base. For example, it is possible to employ, for multilayer elements, the resilient and flexible underlayers described in German Laid-Open Application DOS No. 2,444,118.

Depending on the materials employed, it may be advantageous and necessary, in the case of multilayer elements to be used as photopolymerizable recording materials, to anchor the photopolymerizable layer firmly to the base by means of a layer of adhesive having a thickness of from about 0.5 to 40 $\mu$m. Suitable adhesives are commercial one-component or two-component systems, the nature of which depends on the base material and on the materials in the photopolymerizable layer applied thereto. Commercial two-component adhesives based on polyurethane and polychloroprene are frequently suitable and can be applied in an appropriate thickness to the layers to be bonded, by coating or casting. Very suitable adhesives consist of a mixture of isocyanate-cured phenoxy resins and polycarbonate as described in German Laid-Open Application DOS No. 3,100,175 or of an isocyanate-cured cellulose ether adhesive as described in German Laid-Open Application DOS No. 3,107,741; these compositions may additionally contain an anti-halation agent.

It is often advantageous if the photocurable multilayer elements possess a firmly adhering, thin, non-tacky upper layer on the surface of the photopolymerizable layer which faces away from the base. Such an upper layer advantageously consists of a polymer which forms non-tacky, transparent, tear-resistant films and is soluble in the developer solvent for the photopolymerizable layer, for example a nylon, nylon copolymer, polyurethane, polyvinyl alcohol, polyvinylpyrrolidone, polyethylene oxide of molecular weight greater than 100,000 or cyclized rubber having a high degree of cyclization. The thickness of this upper layer firmly bonded to the photopolymerizable layer is advantageously from about 0.5 to 20 $\mu$m. When producing relief printing plates, this upper layer for example enables the negative to be placed flat on the unexposed plate, without sticking thereto or bubbles being formed due to the presence of trapped air. The upper layer is usually removed together with the non-crosslinked, unexposed areas of the photopolymerizable layer in the washout operation when the relief is developed.

It is also often advantageous if the photosensitive multilayer elements to be used as photopolymerizable recording materials are provided with a strippable cover sheet, which may be either applied directly to the photopolymerizable layer or conjointly with the upper layer mentioned above. Such a cover sheet which may consist, for example, of a nylon or a polyester and which advantageously is from about 20 to 150 $\mu$m. thick is in general peeled off before imagewise exposure of the photosensitive multilayer materials; however, if the cover sheet is sufficiently transparent, exposure may be effected through it, and the sheet is then peeled off before developing.

Photosensitive multilayer elements particularly suitable for the production of elastomeric relief printing plates possess, in addition to the layers mentioned above, a resilient and flexible underlayer as described in German Laid-Open Application DOS No. 2,444,118.

The photosensitive multilayer elements may be produced in a conventional manner, by processing the homogeneous photopolymerizable mixture into a layer of the desired thickness and bonding it to the dimensionally stable base. The photopolymerizable layers may be produced by, for example, casting solutions of the mixtures on the base, as mentioned above, or compression molding, calendering or extruding the photopolymerizable mixtures. To produce the photosensitive recording material, prefabricated photopolymerizable layers may be laminated or pressed onto the base, which may or may not have been coated with an adhesive, or the photopolymerizable mixture, as such, may be applied in a suitable manner, for example by casting a solution of the mixture onto the base, thus forming the photopolymerizable layer. Because of the low melt viscosity of the elastomeric block polymers used according to the invention, the photopolymerizable mixtures can very advantageously be processed by extrusion, calendering or compression molding. The novel photopolymerizable mixtures are moreover easily dosed in crumb form, which greatly assists the feeding of extruders and makes it superfluous to add agents which prevent sticking.

Layers of the novel mixtures can be converted by light exposure, in a conventional manner, into crosslinked, insoluble shaped articles, for example decorative panels, or coatings on films, foils or rolls. In particular, the photosensitive multilayer elements bearing a photopolymerizable layer based on the novel mixtures are suitable for the production of printing plates and relief plates, this being effected in a conventional manner by imagewise exposure of the photopolymerizable layer to actinic light and subsequent removal, in particular washing out, of the unexposed and non-crosslinked areas of the layer by means of a developer solvent. Exposure may be effected with the conventional sources of actinic light, for example commercial ultraviolet fluorescent tubes, medium, high or low pressure mercury vapor lamps, superactinic fluorescent tubes, pulsed xenon lamps, metal iodide-doped lamps, carbon arc lamps etc. The radiation sources are required to emit light of wavelength from 230 to 450 nm, preferably from 300 to 420 nm, the wavelength being matched to the characteristic absorption of the photoinitiator present in the photopolymerizable layer. Suitable developer solvents for washing out the unexposed, non-crosslinked areas of the layer after imagewise exposure include aromatic hydrocarbons and aliphatic halohydrocarbon solvents, for example 1,1,1-trichloroethane, symmetrical tetrachloroethane, tetrachloroethylene, toluene, methyl isobutyl ketone or mixtures of such solvents with lower alcohols, the latter serving to control the washout time. After washing out with the developer solvent, the relief plates obtained are dried in a conventional manner, if necessary at up to 120° C. In some cases it is advantageous subsequently to re-expose the entire surface of the resulting relief plate to actinic light in order to improve its strength.

The novel photosensitive multilayer elements may be used particularly advantageously for the production of resilient and flexible printing plates which are suitable for applications where a resilient printing surface is required. In such cases the photopolymeric relief-forming layer should have a Shore A hardness (DIN 53,505), after exposure, of from 30 to 90, preferably from 40 to 70. A great advantage of the photopolymerizable layers consisting of the novel mixtures is their exceptional clarity which permits the production of relief printing plates with very great relief heights coupled with straight side walls, these features being necessary for printing rough and wavy surfaces, such as corrugated cardboard, boxboard and napkin paper. Relief heights of more than 3 mm can be produced without any problems, as with conventionally molded rubber plates, without polymerization occurring in the deepest portions adjacent to the exposed areas. Moreover, it is advantageous that the elastomeric block copolymers of the novel mixtures permit very good matching of the polymer structure to the desired mechanical properties of the photocrosslinked layer. The printing plates produced from the novel photopolymerizable mixtures and photosensitive multilayer elements exhibit excellent printing characteristics, high resistance to printing ink solvents and can be re-used a large number of times, especially because they show extremely little tendency to craze on storage.

The Examples which follow illustrate the invention. Parts and percentages are by weight, unless stated otherwise. Parts by volume bear the same relation to parts by weight as the liter to the kilogram. The stated intrinsic viscosities (ml/g) were determined by a method based on DIN 51562 and DIN 53726, at 25° C., using an 0.5% strength by weight solution of the polymer in toluene. The molecular weights $M_y$ which are quoted are weight-average molecular weights determined from the intrinsic viscosity. The Shore A hardness was determined by the method of DIN 53505 and the glass transition temperature by the method of DIN 53520. The impact resilience was measured by the method of DIN 53512 and the elongation at break by the method of DIN 53504.

EXAMPLE 1

A photopolymerizable mixture was prepared from:
88 parts of the block copolymer described below,
7.3 parts of hexanediol diacrylate,
3.7 parts of hexanediol dimethacrylate,
1.2 parts of benzil dimethyl ketal,
0.008 part of a black dye (C.I. 26150, Solvent Black 3) and
0.3 parts of 2,6-di-tert.-butyl-p-cresol.

The block copolymer was a three-block copolymer in which the two terminal polymer blocks were random copolymer blocks obtained from 10 parts of styrene and 5 parts of butadiene and having an intrinsic viscosity of 20.2 ml/g and a glass transition temperature of +12° C., whilst the middle block was a polyisoprene block (glass transition temperature −49° C.), which accounted for 50% of the block copolymer. The total molecular weight of the block copolymer was 100,000 and the product had an intrinsic viscosity of 101 ml/g, a Shore A hardness of 29 and an impact resilience of 28%. A 20% strength solution of the block copolymer in toluene showed a transmission of 95% in 1 cm thickness, measured against toluene at 360 nm.

The constituents of the photopolymerizable mixture were dissolved in 100 parts of toluene at 90° C. The solution was applied by means of a doctor blade to a polyethylene terephthalate film which had been coated with a commercial nylon copolymer, the amount applied being such that after drying the layer for 1 hour at 80° C. an 0.7 mm thick film remained. Samples of the multilayer material thus obtained were exposed for 30 minutes in a commercial flat-plate exposure unit (40 watt, ultraviolet fluorescent lamps). The crosslinked photopolymer layer of the exposed samples had a Shore A hardness of 49, an impact resilience of 46%, a tensile strength of 6.8 N/mm$^2$ and an elongation at break of 273%. At 100% elongation, the tensile modulus was found to be 2.0 N/mm$^2$.

To produce a flexographic printing plate, a 75 μm thick polyester film coated with an adhesive was applied by roller to the free surface of the unexposed photopolymerizable layer produced above. The adhesive consisted of an isocyanate-cured phenoxy resin and a polycarbonate, such a mixture being described in German Laid-Open Application DOS No. 3,100,175. The polyester cover sheet, which had been coated with a nylon copolymer, was then removed, leaving the nylon copolymer layer on the surface of the photopolymerizable layer. A photographic negative was placed on the latter and held in intimate contact therewith by means of a plastic film serving as vacuum frame cover, and the multilayer element was then exposed for 12 minutes in a commercial flat-plate exposure unit (40 watt ultraviolet fluorescent tubes). This caused imagewise bleaching of the dye contained in the photopolymerizable layer, which enabled the exposure to be assessed. The exposed layer was washed out in a commercial spray washer for 4.5 minutes at room temperature, using a solvent mixture of 9 parts by volume of tetrachloroethylene and 1 part by volume of n-butanol and was then dried for 1 hour at 80° C. in a through-circulation cabinet dryer; it was then after-treated for 30 seconds with an 0.4% strength aqueous bromine solution. After 10 minutes' post-exposure of the entire surface, the printing plate obtained was clamped on a press cylinder which itself had a 1 mm thick covering of natural rubber, having a Shore A hardness of 30. The surface of the relief printing plate was non-tacky and showed excellent affinity for conventional flexographic printing inks. The printed copies obtained faithfully reproduced the original, the edges being sharply defined. The abrasion resistance, swelling and resilience of the printing plate corresponded to that of conventional rubber blocks. The plate showed no damage after a run of 200,000 impressions.

EXAMPLE 2

A multilayer element was produced according to Example 1 and its photopolymerizable layer was exposed under a test negative which contained various tonal values, namely 10%, 50% and 90% (48 lines/cm screen). A commercial flat-plate exposure unit with 40 watt ultraviolet fluorescent tubes was used; the exposure time was 10 minutes. The samples were then washed out for 5 minutes at room temperature in a 9:1 (by volume) tetrachloroethylene/n-butanol mixture. 4 different samples were produced and were subjected to 5 different after-treatments: Samples 1 and 2: no additional treatment Samples 3 and 4: 5 minutes additional after-treatment with 0.4% strength aqueous bromine solution and 10 minutes post-exposure of the entire surface.

Samples 2 and 4 were adhered to a sheet-metal cylinder of 5.8 cm external diameter and stored at room temperature, exposed to the atmosphere. Samples 1 and 3 were stored flat. All 4 samples were checked daily for surface crazing of the relief layer. All of samples 1 to 4 remained free from crazing (when examined at 10×magnification) for more than 30 days.

COMPARATIVE EXPERIMENT A

A photopolymerizable mixture was produced according to Example 1, but containing, in place of the elastomeric block copolymer employed in Example 1, a commercial polystyrene/polyisoprene/polystyrene three-block copolymer. The block copolymer contained 84% of isoprene and had a total molecular weight of 130,000. An 0.7 mm thick photopolymerizable layer was produced in the same way as described in Example 1, and test samples were produced therewith, and stored, as in Example 2. Samples 2 and 4, which were stored in a stressed condition on sheet-metal cylinders, showed crazing, discernible with the naked eye, in the surface of the relief image sections after as little as 4 days; this crazing made the layer unusable for a printing plate. Sample 3 (stored flat, with after-treatment) showed crazing after 24 to 28 days; sample 1 (stored flat without further after-treatment) showed crazing after 5 to 8 days.

COMPARATIVE EXPERIMENT B

A photopolymerizable mixture was prepared from the same components as in Example 1, except that, in place of the elastomeric block copolymer, a three-block copolymer as described in German Laid-Open Application DOS No. 2,942,183 was employed, which consisted of 8 parts of a polystyrene block, 76 parts of a polyisoprene block and 16 parts of a random copolymer block of styrene and butadiene in the ratio of 2:1. The total molecular weight of this three-block copolymer was 130,000.

To produce the photopolymerizable layer, the procedure in Example 1 was followed. The layer was tested for crazing as described in Example 2; distinct crazing was discernible after 1 to 2 weeks' storage.

EXAMPLE 3

A photopolymerizable mixture was prepared from
85 parts of the block copolymer described below,
8 parts of hexanediol diacrylate,
4 parts of hexanediol dimethacrylate,
1.2 parts of benzil dimethyl ketal,
0.008 part of a black dye (C.I. 26,150, Solvent Black 3) and
0.4 part of 2,6-di-tert.-butyl-p-cresol.

The two outer polymer blocks of the three-block copolymer employed were random copolymer blocks of styrene and butadiene in the ratio of 2:1, whilst the inner polymer block was a polyisoprene block and accounted for 70% of the total block copolymer. The total molecular weight of the block copolymer was 165,000 and the intrinsic viscosity was 147.4 ml/g. In the non-crosslinked state, the block copolymer had a Shore A hardness of 36 and an impact resilience of 26%.

A photopolymerizable layer prepared from the photopolymerizable mixture had a Shore A hardness of 50, and an impact resilience of 34%, after exposure and photocross-linking.

To produce printing plates, a photopolymerizable layer was prepared from the mixture by extrusion, and was bonded to a polyester base film. The cover sheet was a polyester film which had been coated with a soluble nylon copolymer serving as the upper layer; after peeling off the cover sheet, the nylon copolymer layer remained on the photopolymerizable layer. Printing plates were prepared and tested as described in Example 2. No crazing was discernible after the printing plates had been stored for 30 days.

COMPARATIVE EXPERIMENT C

Photopolymerizable layers were prepared—this time by extrusion—from the photopolymerizable mixtures used in Comparative Experiments A and B; these were employed for the production of relief printing plates in the same manner as described in Example 3, and were tested for crazing. In all cases, distinct crazing was discernible after only a few days.

We claim:

1. A photopolymerizable mixture which contains (a) from 40 to 99% by weight, based on (a) and (b), of at least one block copolymer which is soluble in a developer solvent and consists only of elastomeric non-theroplastic polymer blocks, at least two elastomeric polymer blocks having a glass transition temperature of from −20° C. to +15° C. and at least one elastomeric polymer block located between two such blocks and having a glass transition temperature of below −20° C., (b) from 1 to 60% by weight, based on (a) and (b), of at least one photopolymerizable ethylenically unsaturated low molecular weight compound compatible with the elastomeric block copolymer (a), (c) from 0.1 to 10% by weight, based on the total photopolymerizable mixture, of at least one photopolymerization initiator, and (d) from 0 to 40% by weight, based on the total photopolymerizable mixture, of further additives.

2. A photopolymerizable mixture as set forth in claim 1, wherein the elastomeric block copolymer (a) has a molecular weight of from 60,000 to 300,000.

3. A photopolymerizable mixture as set forth in claim 2, wherein the polymer blocks of the block copolymer (a) having a glass transition temperature of from −20° C. to +15° C. have a molecular weight of from 5,000 to 100,000 and the polymer block having a glass transition temperature of below −20° C. has a molecular weight of from 20,000 to 200,000.

4. A photopolymerizable mixture as set forth in claim 1, wherein the polymer block having a glass transition temperature of below −20° C. accounts for from 10 to 90% by weight of the elastomeric block copolymer (a).

5. A photopolymerizable mixture as set forth in claim 1 or 2 or 3 or 4, wherein the polymer blocks having a glass transition temperature of from −20° C. to +15° C. are terminal blocks.

6. A photopolymerizable mixture as set forth in claim 5, wherein the block copolymer (a) is a three-block copolymer whose two terminal polymer blocks are linked by a central polymer block having a glass transition temperature of below −20° C.

7. A photopolymerizable mixture as set forth in claim 1, wherein the polymer blocks having a glass transition temperature of below −20° C. are polybutadiene or polyisoprene blocks.

8. A photopolymerizable mixture as set forth in claim 1, wherein the polymer blocks having a glass transition temperature of from −20° C. to +15° C. are random copolymer blocks of styrene, butadiene and/or isoprene.

9. A photocurable multilayer element useful as a photosensitive recording material, especially for the production of relief plates and printing plates, which comprises a dimensionally stable base and, applied thereto, a firmly adhering photopolymerizable layer of a photopolymerizable mixture as set forth in claim 1.

* * * * *

UNITED STATES PATENT AND TRADEMARK OFFICE
CERTIFICATE OF CORRECTION

PATENT NO. : 4,430,417
DATED : February 7, 1984
INVENTOR(S) : Gerhard HEINZ et al.

It is certified that error appears in the above-identified patent and that said Letters Patent is hereby corrected as shown below:

Claim 1, lines 32 and 33, column 12, correct the word "non-theroplastic" to --non-thermoplastic--.

Signed and Sealed this

Twenty-ninth Day of May 1984

[SEAL]

Attest:

GERALD J. MOSSINGHOFF

Attesting Officer

Commissioner of Patents and Trademarks